(12) United States Patent
Terashima et al.

(10) Patent No.: US 8,123,857 B2
(45) Date of Patent: Feb. 28, 2012

(54) METHOD FOR PRODUCING P-TYPE SIC SEMICONDUCTOR SINGLE CRYSTAL

(75) Inventors: Yukio Terashima, Mishima (JP); Yasuyuki Fujiwara, Shizuoka-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 594 days.

(21) Appl. No.: 12/366,076

(22) Filed: Feb. 5, 2009

(65) Prior Publication Data
US 2009/0194017 A1 Aug. 6, 2009

(30) Foreign Application Priority Data
Feb. 6, 2008 (JP) .................................. 2008-026554

(51) Int. Cl.
*C30B 29/36* (2006.01)

(52) U.S. Cl. ................ 117/82; 117/83; 117/81

(58) Field of Classification Search .................... 117/81, 117/82, 83, 76, 75
See application file for complete search history.

(56) References Cited

U.S. PATENT DOCUMENTS

| 2005/0183657 A1* | 8/2005 | Kusunoki et al. ................. 117/2 |
| 2007/0128960 A1* | 6/2007 | Ghasemi Nejhad et al. ... 442/59 |
| 2010/0288187 A1* | 11/2010 | Terashima et al. .............. 117/73 |

FOREIGN PATENT DOCUMENTS

| JP | 62-69514 | 3/1987 |
| JP | 2000-264790 | 9/2000 |
| JP | 2004-2173 | 1/2004 |
| JP | 2005-82435 | 3/2005 |
| JP | 2006-143555 | 6/2006 |
| JP | 2006-237319 | 9/2006 |
| JP | 2006-347852 | 12/2006 |
| JP | 2007-76986 | 3/2007 |
| JP | 2007-261844 | 10/2007 |

OTHER PUBLICATIONS

Notification of Reason for Refusal in Japanese patent application No. 2008-026554, drafting date Feb. 5, 2010.

* cited by examiner

*Primary Examiner* — Bob M Kunemund
(74) *Attorney, Agent, or Firm* — Finnegan, Henderson, Farabow, Garrett & Dunner, LLP

(57) ABSTRACT

A method for producing a p-type SiC semiconductor single crystal, including: using a solution in which C is dissolved in a Si melt and 30 to 70 at. % Cr and 0.1 to 20 at. % Al, based on a total weight of the Si melt, Cr, and Al, are added to the Si melt, to grow a p-type SiC semiconductor single crystal on a SiC single crystal substrate from the solution.

1 Claim, 2 Drawing Sheets

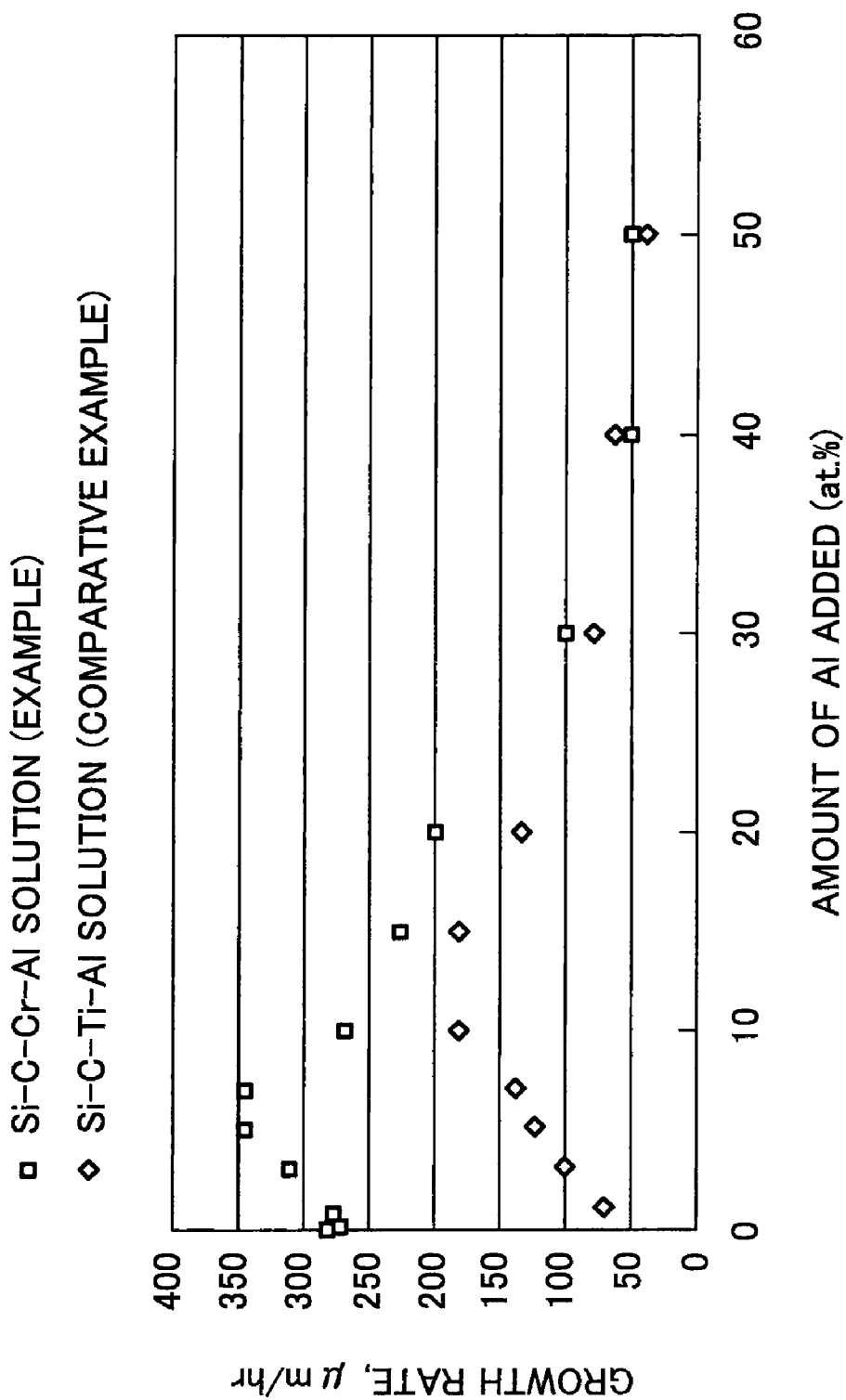

METHOD FOR PRODUCING P-TYPE SIC SEMICONDUCTOR SINGLE CRYSTAL

INCORPORATION BY REFERENCE

The disclosure of Japanese Patent Application No. 2008-026554 filed on Feb. 6, 2008 including the specification, drawings and abstract is incorporated herein by reference in its entirety.

BACKGROUND OF THE INVENTION

1. Field of the Invention

The invention relates to a method for producing a p-type SiC semiconductor single crystal.

2. Description of the Related Art

Practical applications of SiC semiconductors as high-voltage and high-current power semiconductors that are suitable for inverters or the like have been advanced because such semiconductors have better breakdown voltage characteristic, higher temperature resistance, and lower power loss than Si semiconductors. For example, metal oxide semiconductor field effect transistor (MOSFET) or insulated gate bipolar transistor (IGBT) constituting switching elements of inverters are required to have a low ON resistance and a high switching rate. Among n-type and p-type SiC semiconductors for constituting such transistors, the development of n-type semiconductors has been rather significantly advances, whereas the development of p-type semiconductors has been delayed. In particular a demand has been created for a method for producing a p-type SiC semiconductor single crystal at a growth rate necessary for practical use.

Various methods for growing p-type SiC semiconductor single crystals by a solution process have been suggested.

Japanese Patent Application Publication No. 2000-264790 (JP-A-2000-264790) discloses a method using a Si—C—Cr three-component solution prepared by adding Cr to a Si—C solution obtained by dissolving C in a Si melt, describes an exemplary solution composition of Si 23 at. %-C 23 at. %-Cr 54 at. %, and further suggests the possibility of obtaining a p-type SiC semiconductor single crystal by adding Al. However, no specific means for increasing the growth rate is suggested.

Japanese Patent Application Publication No. 2007-76986 (JP-A-2007-76986) discloses growing a p-type SiC semiconductor by a solution method, wherein using a Si—C—Ti—Al four-component solution obtained by complex addition of Ti and Al to a Si—C solution makes it possible to increase the growth rate to 180 μm/hr as an upper limit at which the single crystal growth can be stable. However, for practical use, the growth rate has to be further increased.

Further, as disclosed in Japanese Patent Application Publication No. 2004-2173 (JP-A-2004-2173) and Japanese Patent Application Publication No. 2006-143555 (JP-A-2006-143555), adding Ti increases the amount of precipitated SiC, but when Ti is added alone, polycrystallization is facilitated and stable single crystal growth is very difficult to perform. When Fe is added, the C dissolution effect in a Si melt is even higher than in the case of Ti addition, but the increase in the amount of precipitated SiC is small even when an oversaturation degree is increased by a temperature gradient.

Japanese Patent Application Publication No. 2005-82435 (JP-A-2005-82435), Japanese Patent Application Publication No. 2006-347852 (JP-A-2006-347852), and Japanese Patent Application Publication No. 62-69514 (JP-A-62-69514) disclose producing a p-type SiC semiconductor single crystal by adding Al to a Si—C solution, but no specific means for obtaining a high growth rate necessary for practical use is suggested.

SUMMARY OF THE INVENTION

The invention provides a method for producing a p-type SiC semiconductor single crystal that can realize a level of growth rate necessary for practical use.

A method for producing a p-type SiC semiconductor single crystal according to an aspect of the invention includes using a solution in which C is dissolved in a Si melt and 30 to 70 at. % Cr and 0.1 to 20 at. % Al, based on a total weight of the Si melt, Cr, and Al, are added to the Si melt, to grow a p-type SiC semiconductor single crystal on a SiC single crystal substrate from the solution.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 2 is a graph illustrating by comparison the growth rates of p-type SiC semiconductor single crystals obtained at a constant amount of Cr added of 41 at. %, a constant amount of Ti added of 20 at. %, and a variable amount of Al added in a solution method using a Si—C—Cr—Al four-component solution of the embodiment of the invention and a solution method using a conventional Si—C—Ti—Al four-component solution.

DETAILED DESCRIPTION OF EMBODIMENTS

Figure 1:
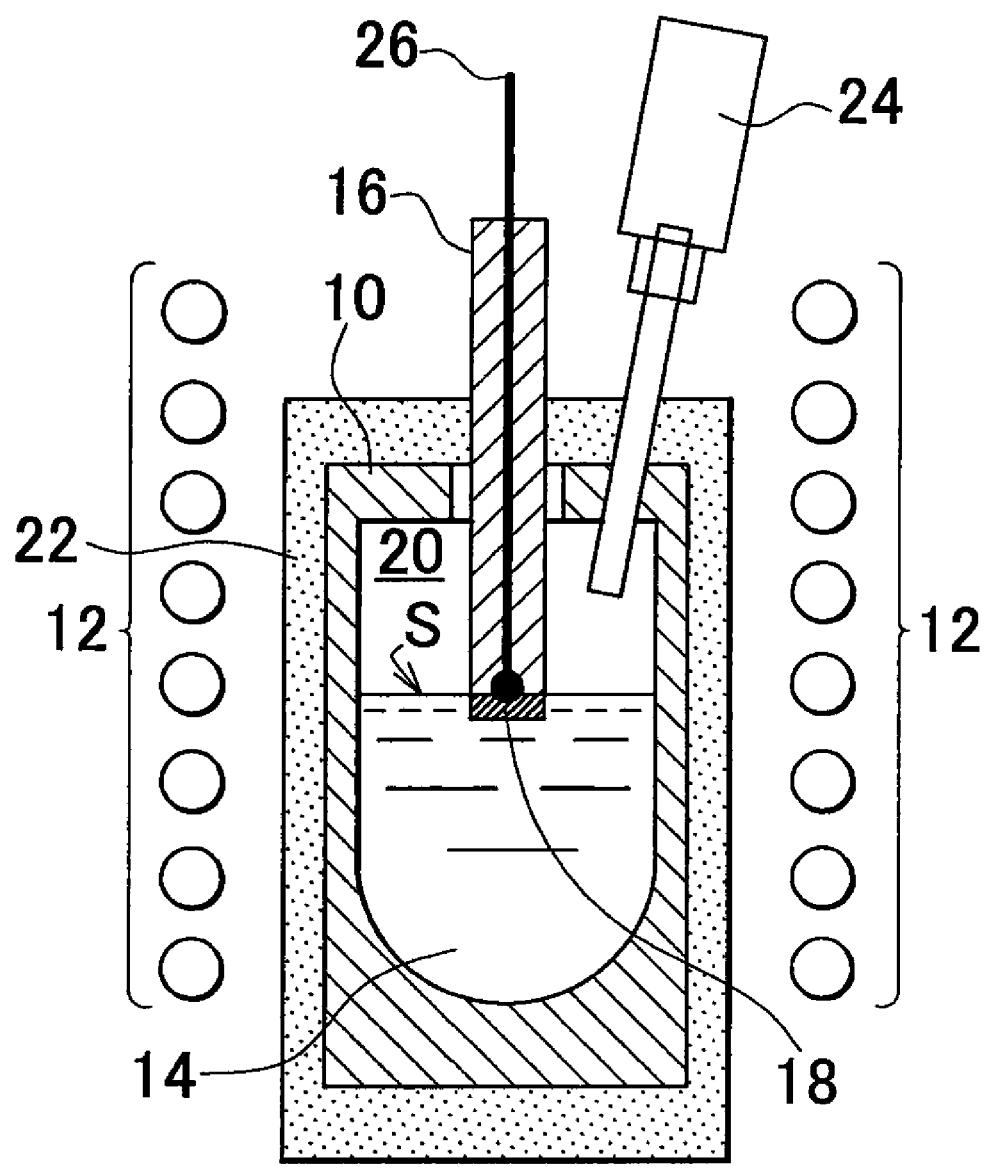
FIG. 1 is a cross-sectional view illustrating a basic configuration of an apparatus used for producing a p-type SiC semiconductor single crystal by a solution method of an embodiment of the invention.

In the embodiment of the invention, a Si—C—Cr—Al four-component solution is used as a solution for growing a p-type SiC semiconductor single crystal by a solution method.

In the embodiment of the invention, the amount of Cr and Al added is a ratio (at. %) of a starting material Cr and a starting material Al based on a total amount (100 at. %) of a loaded amount of a stating material Si and the starting material Cr and starting material Al. Thus the amount of Cr and Al added is not a ratio based on the entire composition of the Si—C—Cr—Al four-component solution.

In the four-component solution of the present embodiment, Si and C are main components constituting a SiC single crystal that will be grown, and Cr and Al are additional components producing the below-described effect.

Thus, Cr increases C solubility in the Si—C solution and increases the supply of Si and C to the SiC single crystal growth surface, thereby increasing a crystal growth rate. For this effect to be obtained with sufficient reliability, the amount of Cr added has to be equal to or higher than 30 at. %. However, where the amount of Cr added exceeds 70 at. %, the grown crystals easily become polycrystals and a flat crystal growth surface that is indispensable for single crystal growth cannot be maintained with good stability. Therefore, the amount of Cr added is restricted to a range of 30 at. % to 70 at. %.

Al functions as a p-type dopant and also, similarly to Cr, increases the solubility of C in the solution, thereby increasing a crystal growth rate. This effect is obtained at an amount of Al added that is equal to or higher than 0.1 at. %. However, where the amount of Al added exceeds 20 at. %, the growth rate rather decreases. In addition, macrodefects are actively generated in the grown crystal and polycrystallization easily occurs. Therefore, the amount of Al added is restricted to a range of 0.1 at. % to 20 at. %.

By using a Si—C—Cr—Al four-component solution in which the amounts of Cr and Al added are within the ranges specified above, it is possible to grow SiC single crystals with good stability at a rate of about 200 μm/hr that could not be achieved with the conventional methods or at a higher rate.

The solution method of the present embodiment can be implemented using a typical conventional SiC single crystal growth apparatus shown in FIG. 1.

Starting materials located in a graphite crucible 10 are heated and dissolved by a high-frequency heating coil 12 wound about the crucible 10 and a solution 14 is formed. A SiC seed crystal 18 supported at a lower end of a graphite support rod 16 located above the melt is brought into contact with a liquid surface S of the solution 14, and a SiC single crystal is grown at a lower surface of the SiC seed crystal 18 in an inactive atmosphere 20 such as Ar gas.

The entire graphite crucible 10 is covered with a thermally insulating material 22. The temperature of liquid surface S is measured in a contactless manner with a radiation thermometer 24, and the rear surface temperature of the seed crystal 18 is measured in a contact manner with a thermocouple 26, e.g. from W—Re.

The radiation thermometer 24 is disposed at an observation window above the liquid surface so that the liquid surface S can be directly observed, and the liquid surface temperature can be measured before and after the seed crystal 18 is brought into contact with the solution 14.

The thermocouple 26 is fixed to an inner side on the lower end (position at a distance of 2 mm from the bonding surface of the seed crystal 18) of the graphite support rod 16 to which the seed crystal 18 is bonded, and the seed crystal temperature can be measured immediately after the seed crystal 18 is brought into contact with the solution 14.

Si is typically charged as a starting material into the graphite crucible 10 and heated with the high-frequency heating coil 12 to form a Si melt. C is dissolved in the Si melt from the inner wall of the graphite crucible 10 and a Si—C solution is formed. Thus, the graphite crucible 10 is basically the starting material of C, but additionally a graphite block may be also charged. Further, the crucible 10 may be made from SiC. In this case, a graphite block has to be charged as a C source.

In the present embodiment, the charging period of Cr, Al starting materials that are components added to the Si—C two-component solution of a basic composition of the SiC single crystal that is to be grown is not particularly limited. Thus, a Si—C—Cr—Al four-component solution of a predetermined composition, temperature, and temperature gradient may be formed at any time before the seed crystal 18 is brought into contact with the liquid surface S and crystal growth is started.

As an embodiment of the present embodiment, Cr and Al are charged in addition to Si as starting materials in predetermined amounts relative to the charged amount of Si and the starting materials are melted by heating to form a Si—Cr—Al solution. In the course of this process, as described hereinabove, C is dissolved from the graphite crucible 10 (and also from a graphite block) in the Si—Cr—Al solution and a Si—C—Cr—Al four-component solution is formed.

As another embodiment, only Si may be initially charged as a starting material and heated to obtain a Si melt or a Si—C solution in which C is dissolved and then Cr and Al may be charged. Cr and Al may be added simultaneously, or they may be added successively or alternately in a plurality of batches.

As yet another embodiment, Si and either of Cr and Al may be charged as starting materials and heated to obtain a Si—Cr solution or a Si—Al solution, or a Si—C—Cr solution or a Si—C—Al solution in which C is dissolved, and then the other of Cr and Al may be added.

A p-type SiC semiconductor single crystal was grown by the below-described procedure and under the below-described conditions by using the apparatus shown in FIG. 1.

Starting materials were loaded in the crucible, heated to 1980° C.±2° C. (liquid surface temperature) at an almost constant rate within about 2 hr, and held at this temperature. This temperature is an average value within a heating and holding temperature range of 1800° C. to 2100° C. that is generally used.

A temperature gradient in the solution was maintained at 1.5 to 1.8° C./mm. This is an average value within a temperature gradient range of 0.8 to 3.0° C./mm that is generally used. The temperature gradient is a gradient at which the temperature decreases upward along the solution height direction.

(Preliminary Test) p-Type SiC semiconductor single crystals were grown using Si—C—Cr three-component solutions obtained by adding only Cr to a Si—C solution in order to study the effect of amount of Cr added on growth rate. The results obtained are shown in Table 1.

TABLE 1

| Si—C—Cr | |
|---|---|
| Amount of Cr added (at. %) | Growth rate (μm/hr) |
| 3 | 0 |
| 5 | 5 |
| 10 | 5 |
| 15 | 3 |
| 20 | 27 |
| 25 | 45 |
| 30 | 160 |
| 40 | 250 |
| 50 | 300 |
| 60 | 350 |
| 70 | 310 |
| 80 | 270 |
| 90 | 180 |

As shown in Table 1, a significant increase in growth rate is observed at an amount of Cr added that is equal to or higher than 30 at. %. In particular, when the amount of Cr added is equal to or higher than 40 at. %, the growth rate accelerates to 250 μm/hr, and when the amount of Cr added is 60 at. %, a maximum amount of 350 μm/hr is attained. This growth rate is higher than 180 μm/hr, which is the upper limit of growth rate attained with the conventional Si—C—Ti—Al solution.

However, when the amount of Cr added exceeded 70 at. %, some or all grown crystals polycrystallized.

Therefore, the adequate range of the amount of Cr added is 30 at. % to 70 at. %.

Example 1 p-Type SiC semiconductor single crystals were grown by using Si—C—Cr—Al four-component solutions in which the amount of Cr added was 41 at. % according to the results of the preliminary test and the amount of Al added was changed within a range of 0.1 at. % to 50 at. %. The results obtained are shown in Table 2.

TABLE 2

| Si—C—Cr—Al | | | | | | | | | | | | |
|---|---|---|---|---|---|---|---|---|---|---|---|---|
| Amount of Al added (at. %) | 0.1 | 0.5 | 1 | 3 | 5 | 7 | 10 | 15 | 20 | 30 | 40 | 50 |
| Amount of Cr added (at. %) | 41 | 41 | 41 | 41 | 41 | 41 | 41 | 41 | 41 | 41 | 41 | 41 |
| Growth rate (μm/hr) | 280 | 268 | 275 | 310 | 340 | 340 | 265 | 225 | 202 | 100 | 50 | 40 |

As shown in Table 2, when the amount of Cr added was 41 at. %, a high growth rate of 280 μm/hr could be realized at an amount of Al added of 0.1 at. %, and a maximum value of 340 μm/hr was obtained at an amount of Al added of 5 at. % and 7 at. %. At an amount of Al added of 20 at. %, high-speed growth was realized at 202 μm/hr, but where the amount of Al added was further increased to 30 at. %, the growth rate decreased rapidly to 100 μm/hr. This is an average value of growth rate attained with the conventional Si—C—Ti—Al solution. When the amount of Al added was equal to or higher than 30 at. %, polycrystallization started and a flat crystal growth surface could not be maintained. Moreover, the occurrence of macrodefects such as solution inclusions into the crystals or voids was significant.

Comparative Example 1

For comparison, p-type SiC semiconductor single crystals were grown using conventional Si—C—Ti—Al solutions. The amount of Ti added was 20 at. % and the amount of Al added was changed within a range of 1 at. % to 50 at. %. The results obtained are shown in Table 3.

TABLE 3

| Si—C—Ti—Al | | | | | | | | | | | | |
|---|---|---|---|---|---|---|---|---|---|---|---|---|
| Amount of Al added (at. %) | 0.1 | 0.5 | 1 | 3 | 5 | 7 | 10 | 15 | 20 | 30 | 40 | 50 |
| Amount of Ti added (at. %) | — | — | 20 | 20 | 20 | 20 | 20 | 20 | 20 | 20 | 20 | 20 |
| Growth rate (μm/hr) | — | — | 68 | 98 | 121 | 135 | 180 | 180 | 130 | 75 | 65 | 32 |

As shown in Table 3, a growth rate in excess of about 100 μm/hr was obtained with an amount of Al added within a range of 3 at. % to 20 at. % with respect to an amount of Ti added of 20 at. %, but even the maximum value of growth rate obtained at an amount of Al added of 10 at. % and 15 at. % was 180 μm/hr and it is clear that in Example 1 the growth rate attained at the same amount of Al added was much higher.

The results obtained in Example 1 and Comparative Example 1 are compared in FIG. 2. FIG. 2 clearly demonstrates superiority of the Si—C—Cr—Al solution of Example 1 over the conventional Si—C—Ti—Al solution.

Comparative Example 2

An amount of Cr added was at a constant level of 20 at. %, which is lower than 30 at. %, other conditions being the same as in Example 1. The results obtained are shown in Table 4.

TABLE 4

| Si—C—Cr—Al | | | | | | | | | | |
|---|---|---|---|---|---|---|---|---|---|---|
| Amount of Al added (at. %) | 0.1 | 0.5 | 1 | 3 | 5 | 7 | 10 | 15 | 20 | 30 |
| Amount of Cr added (at. %) | — | 20 | 20 | — | 20 | — | 20 | 20 | — | 20 |
| Growth rate (μm/hr) | — | 25 | 23 | — | 75 | — | 105 | 120 | — | 70 |

Because the amount of Cr added was insufficient, the growth rate did not exceed 120 μm/hr even at a maximum value obtained at an amount of Al added of 15 at. %. The growth rate at the same amount of Al added was lower than that attained with the amount of Cr added within the range of the invention.

Example 2

An amount of Cr added was at a constant level of 30 at. %, other conditions being the same as in Example 1. The results obtained are shown in Table 5.

Within a region in which the amount of Al added was equal to or less than 1 at. %, the growth rate was somewhat below 100 μm/hr, but when the amount of Al added was increased to a region of equal to or higher than 5 at. % to 20 at. %, high speed growth at a rate of 163 to 180 μm/hr could be performed.

TABLE 5

| Si—C—Cr—Al | | | | | | | | | | |
|---|---|---|---|---|---|---|---|---|---|---|
| Amount of Al added (at. %) | 0.1 | 0.5 | 1 | 3 | 5 | 7 | 10 | 15 | 20 | 30 |
| Amount of Cr added (at. %) | 30 | 30 | 30 | — | 30 | — | 30 | 30 | 30 | 30 |
| Growth rate (μm/hr) | 92 | 90 | 98 | — | 163 | — | 174 | 180 | 165 | 135 |

Example 3

An amount of Cr added was at a constant level of 47 at. %, other conditions being the same as in Example 1. The results obtained are shown in Table 6.

Growth at a high rate of 245 μm/hr to 387 μm/hr could be attained over the entire range of the amount of Al added of 0.1 to 20 at. %.

TABLE 6

| Si—C—Cr—Al | | | | | | | | | | |
|---|---|---|---|---|---|---|---|---|---|---|
| Amount of Al added (at. %) | 0.1 | 0.5 | 1 | 3 | 5 | 7 | 10 | 15 | 20 | 30 |
| Amount of Cr added (at. %) | 47 | 47 | 47 | 47 | 47 | 47 | 47 | 47 | 47 | 47 |
| Growth rate (μm/hr) | 281 | 272 | 269 | 321 | 355 | 387 | 298 | 245 | 256 | 122 |

Example 4

An amount of Cr added was at a constant level of 55 at. %, other conditions being the same as in Example 1. The results obtained are shown in Table 7.

Growth at a high rate of 266 μm/hr to 365 μm/hr could be attained over the entire range of the amount of Al added of 0.1 to 20 at. %.

TABLE 7

| Si—C—Cr—Al | | | | | | | | | | |
|---|---|---|---|---|---|---|---|---|---|---|
| Amount of Al added (at. %) | 0.1 | 0.5 | 1 | 3 | 5 | 7 | 10 | 15 | 20 | 30 |
| Amount of Cr added (at. %) | — | 55 | 55 | — | 55 | — | 55 | 55 | — | 55 |
| Growth rate (μm/hr) | — | 275 | 266 | — | 365 | — | 333 | 288 | — | 175 |

Example 5

An amount of Cr added was at a constant level of 60 at. %, other conditions being the same as in Example 1. The results obtained are shown in Table 8.

Growth at a high rate of 226 μm/hr to 350 μm/hr could be attained over the entire range of the amount of Al added of 0.5 to 15 at. %.

TABLE 8

| Si—C—Cr—Al | | | | | | | | | | |
|---|---|---|---|---|---|---|---|---|---|---|
| Amount of Al added (at. %) | 0.1 | 0.5 | 1 | 3 | 5 | 7 | 10 | 15 | 20 | 30 |
| Amount of Cr added (at. %) | — | 60 | 60 | — | 60 | — | 60 | 60 | — | 60 |
| Growth rate (μm/hr) | — | 278 | 274 | — | 350 | — | 281 | 226 | — | 112 |

Thus, in Example 2 to Example 5, growth at a high rate of equal to or higher than about 100 μm/hr with a maximum rate of 387 μm/hr could be also attained using a Si—C—Cr—Al four-component solution with an amount of Cr added of 30 to 70 at. % and an amount of Al added of 0.1 to 20 at. %.

With the method in accordance with the present embodiment, by adding a combination of Cr and Al in amounts within the ranges specified above to a Si—C solution, it is possible to grow a p-type SiC semiconductor single crystal at a rate much higher than the highest rate attained with the conventional methods.

What is claimed is:

1. A method for producing a p-type SiC semiconductor single crystal on a SiC single crystal substrate from a solution, in which C is dissolved in a Si melt, the method comprising: using the solution in which 30 to 70 at. % Cr and 3 to 20 at. % Al are added, based on a total weight of the Si melt, Cr, and Al.

* * * * *